United States Patent
Gao

(10) Patent No.: US 12,225,693 B2
(45) Date of Patent: Feb. 11, 2025

(54) SERVER PACKAGING FOR IMMERSION COOLING WITH LOCAL ACCELERATION

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 255 days.

(21) Appl. No.: 17/699,490

(22) Filed: Mar. 21, 2022

(65) Prior Publication Data

US 2023/0301035 A1     Sep. 21, 2023

(51) Int. Cl.
*H05K 7/20*         (2006.01)

(52) U.S. Cl.
CPC ............ *H05K 7/208* (2013.01); *H05K 7/203* (2013.01); *H05K 7/20409* (2013.01)

(58) Field of Classification Search
CPC .... H05K 7/208; H05K 7/203; H05K 7/20409; H05K 7/20809; H05K 7/20236; H05K 7/20254; G06F 1/20
See application file for complete search history.

(56) References Cited

U.S. PATENT DOCUMENTS

| | | | | |
|---|---|---|---|---|
| 5,021,924 A * | 6/1991 | Kieda | ............. | H01L 23/4336 |
| | | | | 361/698 |
| 5,514,906 A * | 5/1996 | Love | ............. | H01L 23/473 |
| | | | | 257/E23.098 |
| 10,971,421 B1 * | 4/2021 | He | ............. | H05K 1/0203 |
| 2010/0103620 A1 * | 4/2010 | Campbell | ............. | H05K 7/20772 |
| | | | | 361/702 |
| 2010/0290190 A1 * | 11/2010 | Chester | ............. | H05K 7/20281 |
| | | | | 174/547 |
| 2014/0078672 A1 * | 3/2014 | Brunschwiler | ............. | H05K 7/20772 |
| | | | | 361/699 |
| 2015/0189796 A1 * | 7/2015 | Shedd | ............. | F28F 13/06 |
| | | | | 165/104.31 |
| 2016/0330872 A1 * | 11/2016 | Shelnutt | ............. | H05K 7/20809 |
| 2019/0364699 A1 * | 11/2019 | Gao | ............. | H05K 7/20254 |
| 2021/0153340 A1 * | 5/2021 | Lee | ............. | G06F 1/184 |
| 2021/0185850 A1 * | 6/2021 | Kulkarni | ............. | H05K 7/20327 |
| 2022/0159874 A1 * | 5/2022 | Chen | ............. | F16L 19/028 |

* cited by examiner

*Primary Examiner* — Stephen S Sul
*Assistant Examiner* — Jeffrey Francis Stoll
(74) *Attorney, Agent, or Firm* — WOMBLE BOND DICKINSON (US) LLP

(57) ABSTRACT

A cooling unit includes a channel frame assembled to a server chassis to form a region enclosing an electronic chip that is disposed on a server board contained within the server chassis, an inlet port coupled to a first side of the channel frame to receive a coolant fluid, an outlet port coupled to a second side of the channel frame for coolant fluid in either a liquid phase or a vapor phase to exit the channel frame, and an internal structure disposed on an inner surface of the channel frame between the inlet port and the outlet port. The internal structure guides the coolant fluid flow and/or distribution along a surface of the electronic chip, where the electronic chip transfers heat to the coolant fluid to cause a portion of the coolant fluid to change from a liquid to a vapor phase.

20 Claims, 7 Drawing Sheets

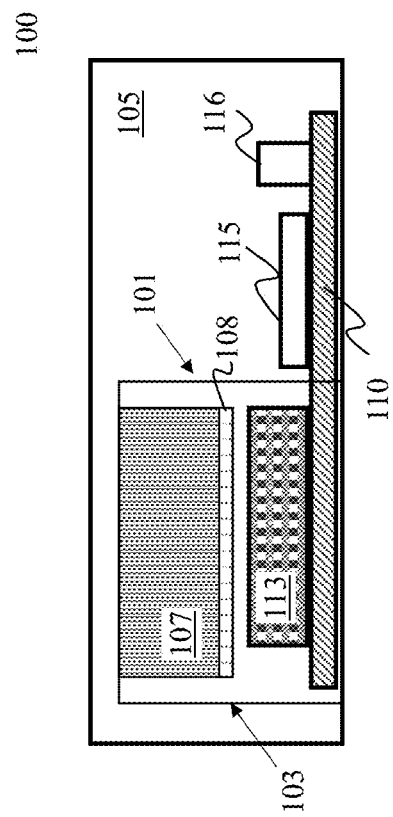
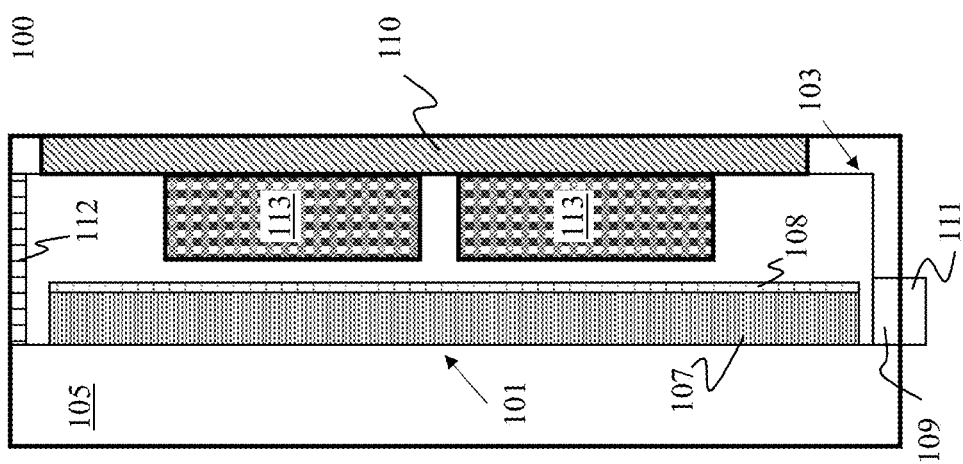
Figure 1B
Figure 1A

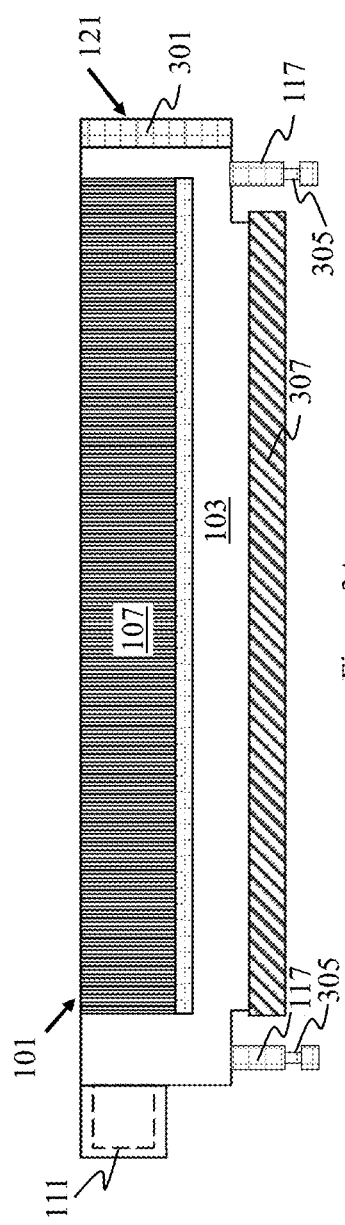
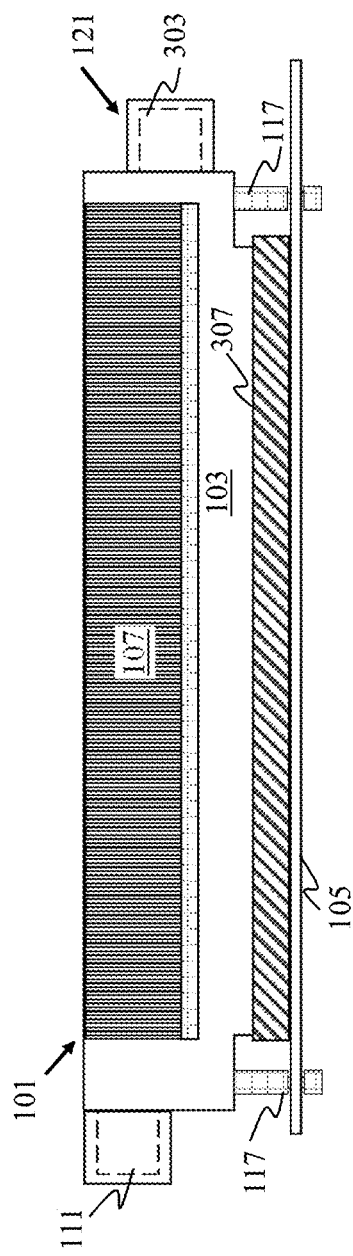

SERVER PACKAGING FOR IMMERSION COOLING WITH LOCAL ACCELERATION

FIELD OF THE INVENTION

Embodiments of the present invention relate generally to data center and energy storage system cooling. More particularly, embodiments of the invention relate to server packaging for immersion cooling with local acceleration.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying high-power density electronic racks, where a large quantity of high-density chips are packaged closer together to provide more computing power. Cooling these high-density racks by maintaining a proper thermal environment may be an issue with existing cooling systems, such as a computer room air conditioning (CRAC) unit. For instance, although the CRAC unit may maintain the thermal environment with more conventional (or lower-density) racks, the unit may be unable to effectively cool high-power density racks because they may generate heat load at a higher rate due to the higher density electronics. Or significant cost may be needed for upgrading a CRAC system to satisfy a cooling requirement of a high-density deployment. Another challenge for air-cooling high-density racks is moving a large amount of airflow sufficient to cool the racks. Since heat removal capacity of fluid is much larger than heat removal capacity of air, thus it is more economical to move cooling fluid for cooling. Therefore, designing the cooling fluid closer to the IT, indirectly or directly in contact with electronics are an effective mean.

There has been much effort and work on development of more efficient and effective thermal management solutions for servers and data centers, such as hybrid cooling, liquid cooling. However, there continues to be challenges since the power density of electronics continues to increase. Immersion cooling may be a possible mean for high power density scenarios.

Immersion cooling, which involves at least partially submerging electronics in a non-conductive dielectric solution, is a feasible solution for high-density electronics. Existing solutions for immersion cooling only considers fluid recirculation for an electronic rack without local cooling acceleration. Heterogeneous electronic components that can give rise to predictable hot spots with immersion cooling. Therefore, there is a need for local cooling acceleration to accommodate hot spots for different electronic hardware, chips, and configurations.

BRIEF DESCRIPTION OF THE DRAWINGS

Embodiments of the invention are illustrated by way of example and not limitation in the figures of the accompanying drawings in which like references indicate similar elements.

FIG. 1A is a block diagram illustrating a side view, FIG. 1B is a block diagram illustrating a front view.

FIG. 3A is a block diagram illustrating open perforation at the outlet of a fluid cooling unit according to one embodiment.

FIG. 3B is a block diagram illustrating a fluid connector at the outlet of a fluid cooling unit according to one embodiment.

DETAILED DESCRIPTION

Figure 1C:
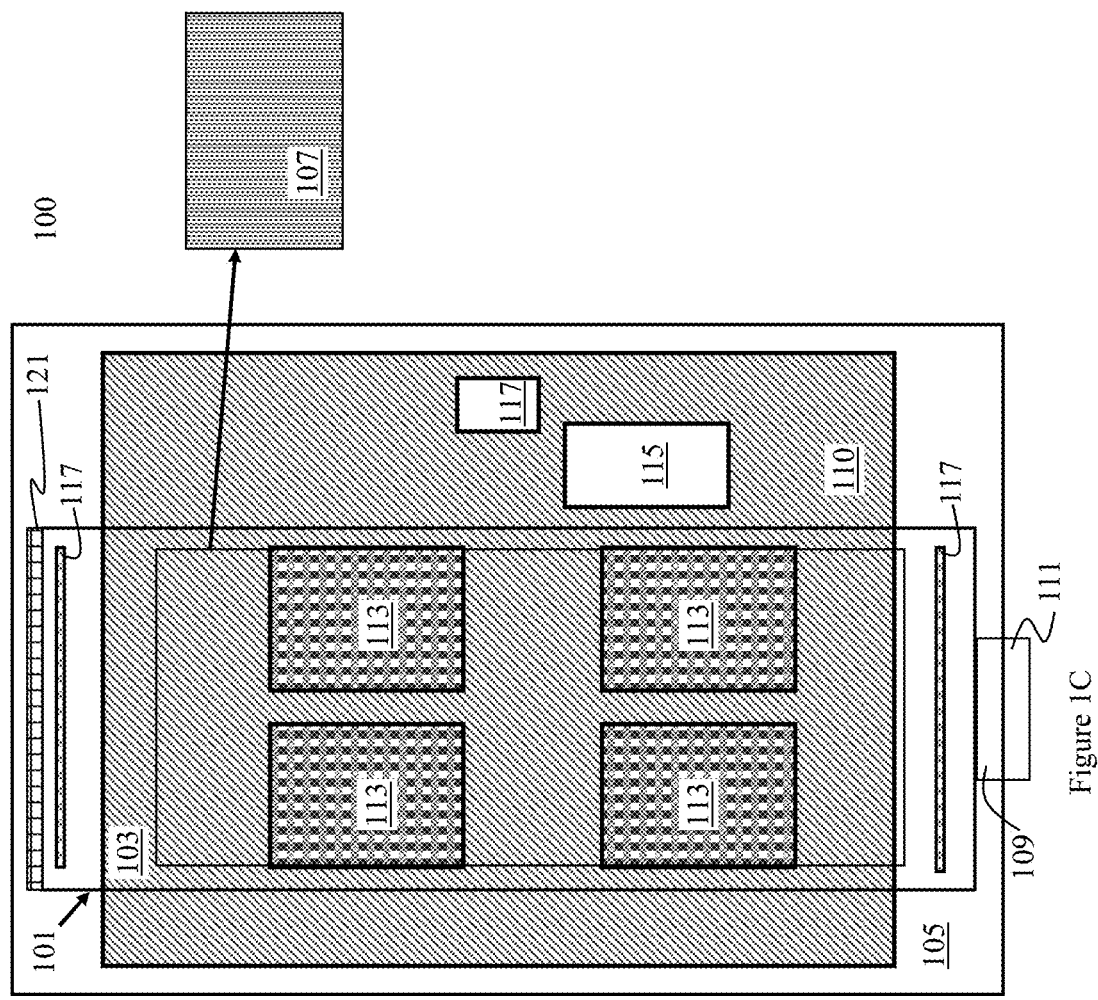
FIG. 1C is a block diagram illustrating a top view of a server package having a server chassis secured to a fluid cooling unit according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the present disclosure relates to server packaging for immersion cooling with two-phase local acceleration. Existing solutions for two-phase immersion system uses an information technology (IT) enclosure with servers submerged in the enclosure but do not address hot spots that arise from the high power density electronics of the servers.

Embodiments of the current disclosure present a server level package for local two-phase coolant acceleration. The server package work for server clusters with minimal modifications to existing server chassis and their immersion cooling environments to address the hot spots efficiently.

According to a first aspect, a cooling unit includes a channel frame assembled to a server chassis to form a region enclosing an electronic chip that is disposed on a server board contained within the server chassis, an inlet port coupled to a first side of the channel frame to receive a two-phase coolant fluid, an outlet port coupled to a second side of the channel frame for two-phase coolant fluid in either a liquid phase or a vapor phase to exit the channel frame, and an internal structure disposed on an inner surface of the channel frame between the inlet port and the outlet port. The internal structure guides the two-phase coolant fluid along a surface of the electronic chip, where the electronic chip transfers heat to the two-phase coolant fluid to cause a portion of the two-phase coolant fluid to change from a liquid to a vapor phase.

In one embodiment, the internal structure comprises a set of fins, each fin aligned along a length between the inlet and outlet ports to form a plurality of fluid channels, wherein the set of fins in the aggregate is asymmetrical to the internal structure, wherein the plurality of fluid channels directs the two-phase coolant fluid to flow unevenly along the surface of the electronic chip.

In one embodiment, the internal structure comprises a set of fins, each fin aligned along a length between the inlet and outlet ports to form a plurality of fluid channels, wherein the set of fins in the aggregate is symmetrical to the internal structure, wherein the plurality of fluid channels directs the two-phase coolant fluid to flow evenly along the surface of the electronic chip.

In one embodiment, the server chassis is submerged in an immersion fluid.

In one embodiment, the outlet port is an open perforation, the two-phase coolant fluid is a same fluid as an immersion fluid, and the two-phase coolant fluid that exits the channel frame merges with the immersion fluid.

In one embodiment, the outlet port is coupled to a connector connecting the outlet port to a fluid line, the two-phase coolant fluid is a different fluid than an immersion fluid, and the fluid line directs the two-phase coolant fluid that exits the channel frame to a facility cooler.

In one embodiment, the cooling unit further includes an assembly kit that is used to secure the channel frame to the server chassis.

In one embodiment, the cooling unit further includes a server chassis extension secured to the server chassis, the server chassis extension extends a length of the server chassis and an assembly kit is secured to the chassis extension, wherein the assembly kit is used to secure the channel frame to the chassis extension.

In one embodiment, the assembly kit includes a first assembly structure disposed on the server chassis near the inlet port and a second assembly structure disposed on the server chassis near the outlet port, wherein the first and second assembly structures are used to secure the channel frame to the server chassis.

According to a second aspect, a server includes a server chassis securing a server board to the server chassis and a cooling unit. The cooling unit includes a channel frame assembled to the server chassis to form a region enclosing an electronic chip that is disposed on the server board contained within the server chassis, an inlet port coupled to a first side of the channel frame to receive a two-phase coolant fluid, an outlet port coupled to a second side of the channel frame for two-phase coolant fluid in either a liquid phase or a vapor phase to exit the channel frame, and an internal structure disposed on an inner surface of the channel frame between the inlet port and the outlet port. The internal structure guides the two-phase coolant fluid along a surface of the electronic chip, where the electronic chip transfers heat to the two-phase coolant fluid to cause a portion of the two-phase coolant fluid to change from a liquid to a vapor phase.

According to a third aspect, a cooling system includes one or more servers, each server includes a server chassis securing a server board to the server chassis and a cooling unit. The cooling unit includes a channel frame assembled to the server chassis to form a region enclosing an electronic chip that is disposed on the server board contained within the server chassis, an inlet port coupled to a first side of the channel frame to receive a two-phase coolant fluid, an outlet port coupled to a second side of the channel frame for two-phase coolant fluid in either a liquid phase or a vapor phase to exit the channel frame, and an internal structure disposed on an inner surface of the channel frame between the inlet port and the outlet port. The internal structure guides the two-phase coolant fluid along a surface of the electronic chip, where the electronic chip transfers heat to the two-phase coolant fluid to cause a portion of the two-phase coolant fluid to change from a liquid to a vapor phase.

FIG. 1A is a block diagram illustrating a side view, FIG. 1B is a block diagram illustrating a front view, and FIG. 1C is a block diagram illustrating a top view of a server package having a server chassis secured to a fluid cooling unit according to one embodiment. Referring to FIGS. 1A-1B, server package 100 includes a server chassis 105. Server chassis 105 has a printed circuit board (PCB) or server board 110 secured therein. Server board 110 includes one or more high power density electronic chips 113 integrated to server board 110. A cooling unit 101 can be disposed on server chassis 105 to form a dedicated fluid channel for certain regions of server board 110 which one or more electronics components (e.g., chips 113, electronic components 115-116) are integrated thereon. The dedicated fluid channel has local fluid acceleration with a fluid flow that is faster than the fluid movement in an immersion environment enabling local fluid acceleration.

In one embodiment, server board 110 can be part of a server of a data center can be configured to provide information technology (IT) services. Specifically, servers of the data center may include a host server (referred to as a host node) and/or one or more compute servers (also referred to as computing nodes, such as CPU server and GPU server). The host server (having one or more CPUs) typically interfaces with clients (not shown) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, the servers can perform any type of computing task and/or can be any type of computing device (e.g., a server, a storage device, etc.) with various high power density components, such as memory modules, central/graphical processing units, accelerator units, etc. In one embodiment, the servers can be edge computing devices. Thus, while the servers provide the IT services, electronic components of the servers generate heat that forms hot spots on the electronic components.

Referring to FIG. 1A, in one embodiment, cooling unit 101 includes channel frame 103, internal structure 107, internal connection 109, inlet port 111, and outlet 112. Channel frame 103 can include an aluminum, stainless steel metal frame, or the like. Channel frame 103 can have a form factor forming a region to cover a region of server PCB board 110. The enclosure region can enclose chips 113. Note that some electronic components 115-116 are not covered by channel frame 103 which means that there is no dedicated acceleration channel integrated with these electronic components 115-116. In one embodiment, channel frame 103 includes flexible (rubber-like) skirt edges, which when secured to server chassis the skirt is in contact with server board 110 and/or server chassis 105, as further shown in FIGS. 3A-3B.

Internal structure 107 can be used to manage a flow and improve a performance of the coolant fluid. For example, internal structure 107 can be used as a coolant fluid distributor that can distribute fluid throughout frame 103 and guide coolant fluid to chips 113. This way, the coolant fluid would not just enter inlet port 111 follow by exiting outlet 112.

In one embodiment, internal structure 107 can include a set of cooling fins. The set of cooling fins can include copper, aluminum, or any thermal conductive fins, etc. Each fin can be aligned along a length between inlet and outlet ports 111-112 to form a number of fluid channels where fluid can flow at a high flow rate. In one embodiment, internal structure 107 includes a layer 108 with perforated openings disposed on an underside of the set of fins. The perforated openings can guide/distribute fluid to the surface of the electronic chip. In one embodiment, internal structure 107 and layer 108 can be machined as a single component. In one embodiment, layer 108 is attached to internal structure 107 as a separate component. In one embodiment, the set of fins in the aggregate can be asymmetrical or symmetrical to the internal structure 107. For example, the fins can distribute fluid evenly along the surface of the electronic chip when the fins are symmetry. the fins can distribute fluid unevenly (such as towards one side) along the surface of the electronic chip when the fins are asymmetry. Such an arrangement may be useful when the high-density chips that is targeted for local fluid acceleration is much smaller than the internal structure 107, or only part of a region covered by internal structure 107 requires local fluid acceleration, there is a wherein the plurality of fluid channels directs the two-phase coolant fluid to flow unevenly along the surface of the electronic chip.

Figure 6:
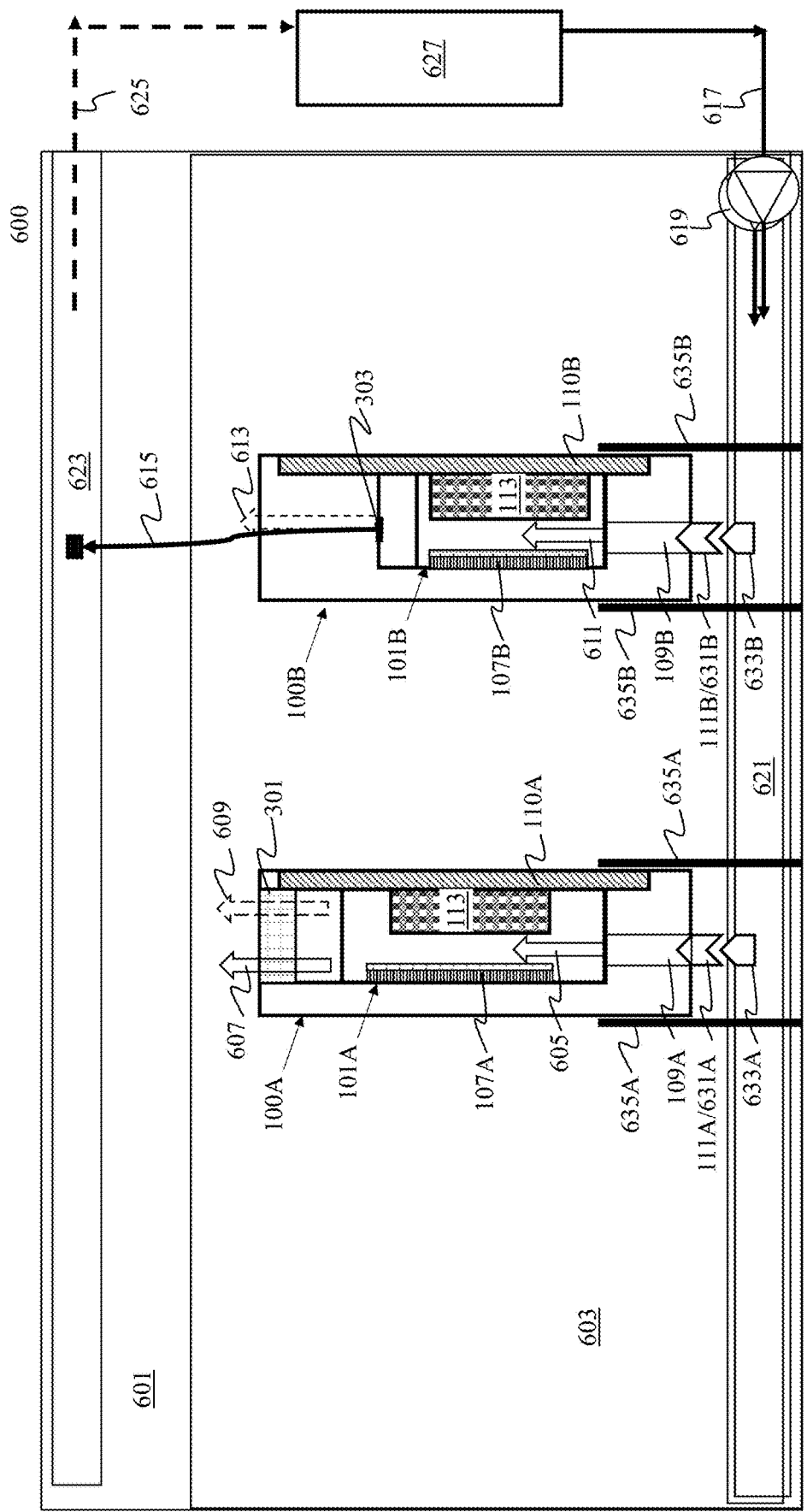
FIG. 6 illustrates an IT cooling system according to one embodiment.

Inlet port 111 can be disposed on a side of channel server chassis 105 to receive a two-phase coolant fluid from a distribution line, as further shown in FIG. 6. Inlet port 111 can be connected by an internal connection 109 to channel frame 103, where internal connection 109 serve as a fluid connection between server chassis 105 and channel frame 103 where fluid can flow from inlet port 111 to channel frame 103. Outlet 112 can be a connection port or an open perforation at a distal end from inlet port 111 for fluid to exit channel frame 103.

In one embodiment, channel frame 103 is secured to an assembly kit, where the assembly kit includes assembly structures 117 that integrates/assembles channel frame 103 to server chassis 105. Assembly kit can be packaged as a module to integrate cooling units to a server chassis.

Referring to FIG. 1C, channel frame 103 can cover a dedicated region where high power density chips 113 are located. In one embodiment, cooling unit 101 can be considered as a separate component from server chassis 105. Such a setup allows cooling units of different sizes and configurations to be integrated with existing server chassis.

Figure 2:
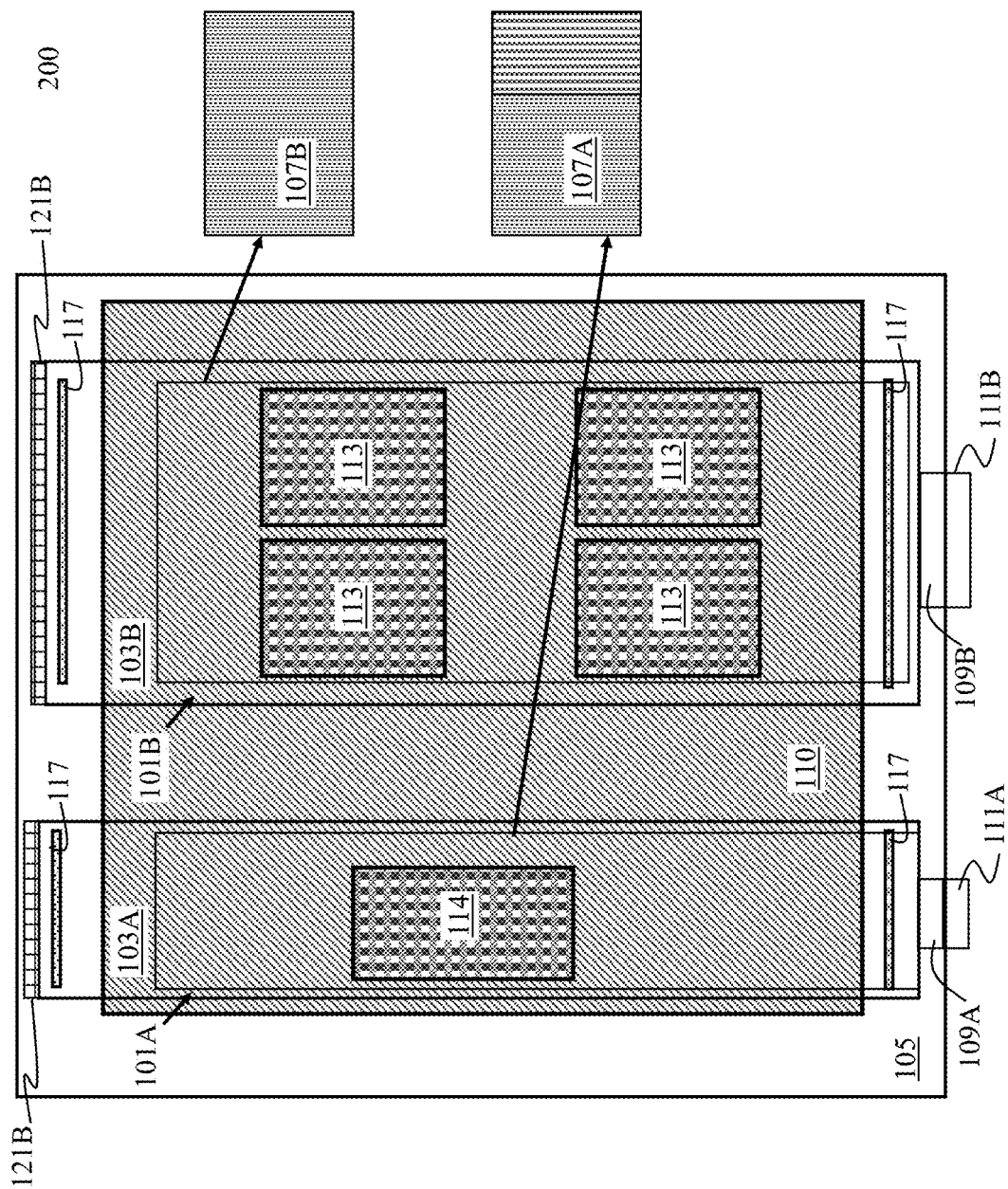
FIG. 2 is a block diagram illustrating a top view of a server package having a server chassis secured to multiple fluid cooling units according to one embodiment.

FIG. 2 is a block diagram illustrating a top view of a server package 200 having server chassis 105 secured to multiple fluid cooling units 101A-101B according to one embodiment. Server package 200 can represent server package 100 of FIG. 1A but with two fluid cooling units secure to server board 110. Referring to FIG. 2, fluid cooling unit 101B forms an enclosed region for chips 113 and fluid cooling unit 101A forms another enclosed region for chip 114 on the same server board 110. Although two cooling units are shown, any number of cooling units can be integrated to a server chassis.

In one embodiment, inlet port 111A and inlet port 111B are separate ports that are connected to a same source of two-phase coolant fluid or to different sources of two-phase coolant fluid. Internal connections 109A-109B can fluidly couple inlet ports 111A-111B to respective channel frames 103A-103B. Two-phase coolant fluid can accelerate through internal structures 107A-107B where internal structures 107A-107B can distribute the fluid throughout cooling units 103A-103B and to chips 113, 114. In one embodiment, internal structures 107A-107B can be an asymmetrical and/or symmetrical structure. For example, internal structure 107A can include a set of fins disposed on an inner panel of channel frames 103A from inlet port 111A to outlet 121A forming a number of fluid channels. The set of fins can be asymmetrical with respect to internal structure 107A to distribute fluid unevenly. In this scenario, fluid is distributed towards the left, e.g., at chip 114. In another example, internal structure 107B can include a set of fins disposed on an inner panel of channel frames 103B from inlet port 111B to outlet 121B forming a number of fluid channels. The set of fins can be symmetrical with respect to internal structure 107A to distribute fluid evenly. In this scenario, fluid is distributed evenly to the left and to the right of chips 113. Although the cooling unit is shown with one internal structure, any number of internal structures can be disposed on a cooling unit. In one embodiment, inlet ports 111A and 111B may be connected to different local fluid loops with different fluid flow rates.

FIG. 3A is a block diagram illustrating open perforation at the outlet of a cooling unit according to one embodiment. FIG. 3B is a block diagram illustrating a fluid connector at the outlet of a cooling unit according to one embodiment. As shown in FIGS. 3A-3B, cooling unit 101 can include inlet connector 111 at one end and outlet 121 at a distal end. In one embodiment, outlet 121 can include open perforation 301 at the distal end. In another embodiment, cooling unit 101 can include inlet connector 111 at one end and outlet 121 can include outlet connector 303 at a distal end.

To secure cooling unit to a server chassis, cooling unit 101 can include two assembly structures 117 disposed on a bottom side of channel frame 103, one near inlet port 111 and another near outlet 121. Assembly structures can include a mounting mechanism to secure the channel frame to the server chassis. For example, assembly structures 117 can include an indentation 305. Server chassis 105 can include corresponding complementary hole/slit that allows assembly structures 117 to lock into. FIG. 3B shows when server chassis 105 is secured to channel frame 103, indentation 305 of assembly structures 117 is fitted to the hole/slit of server chassis 105.

It needs to be mentioned that channel frame 103 does not necessarily form a fully sealed environment for the enclosed region on a server board, this means that the coolant fluid can exit from cooling unit 101 from gaps between cooling unit 101 and the server board. In one embodiment, channel frame 103 can include flexible skirts 307 surrounding frame 103. Flexible skirts can fit over portions of server chassis 105 and/or server board 110 to minimize coolant fluid from exiting through the gaps.

Figure 4:
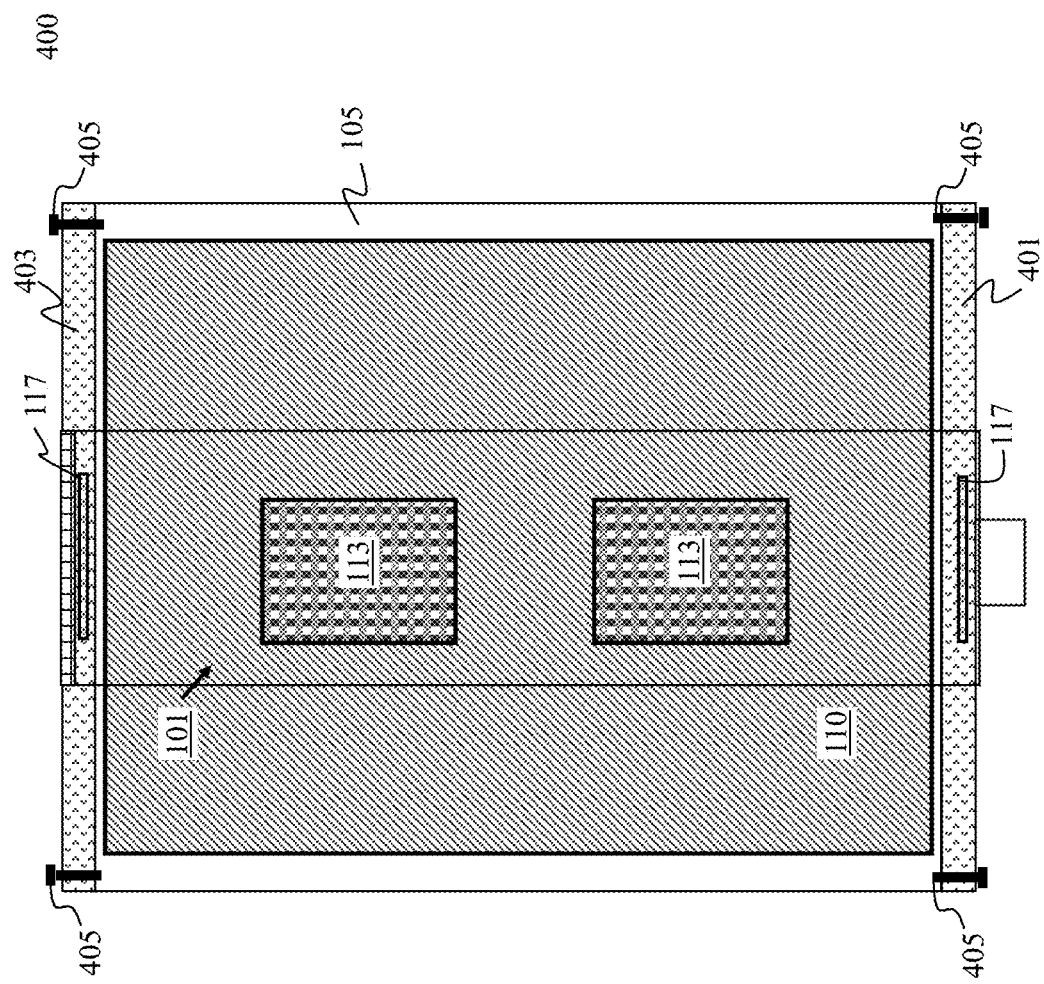
FIG. 4 is a block diagram illustrating a top view of a modified server chassis with a server chassis extension according to one embodiment.

FIG. 4 is a block diagram illustrating a top view of a modified server chassis 400 with server chassis extensions 401 and 403 according to one embodiment. To minimize design changes to existing server chassis, because some server chassis/server board combination have server board fully occupying a length of the server chassis, additional space needs to be added for the mounting structures placements. As shown in FIG. 4, modified server chassis 400 includes chassis extensions 401 and 403 that are integrated to base server chassis 105. Chassis extensions 401 and 403 can be integrated to base server chassis 105 by removing side panels of existing server chassis 105 and assembling the chassis extensions 401 and 403 in place of the side panels. Depending on the server chassis 105 designs, the side panels may be secure to server chassis with screws 405 or the like, and assembling chassis extensions 401 and 403 might involve removing the side panels and securing chassis extensions 401 and 403 to server chassis 105 via screw 405 or the like. Thereafter, assembly structures 117 can be secured to chassis extensions 401 and 403 that have the complementary holes/slits to fit the assembly structures 117.

Here, assembly structures 117 can secure cooling unit 101 to chassis extensions 401 and 403 without major modification to existing server chassis 105 for the cooling unit integration, increasing flexibility of the cooling unit assembly/integration to existing server chassis.

Figure 5A:
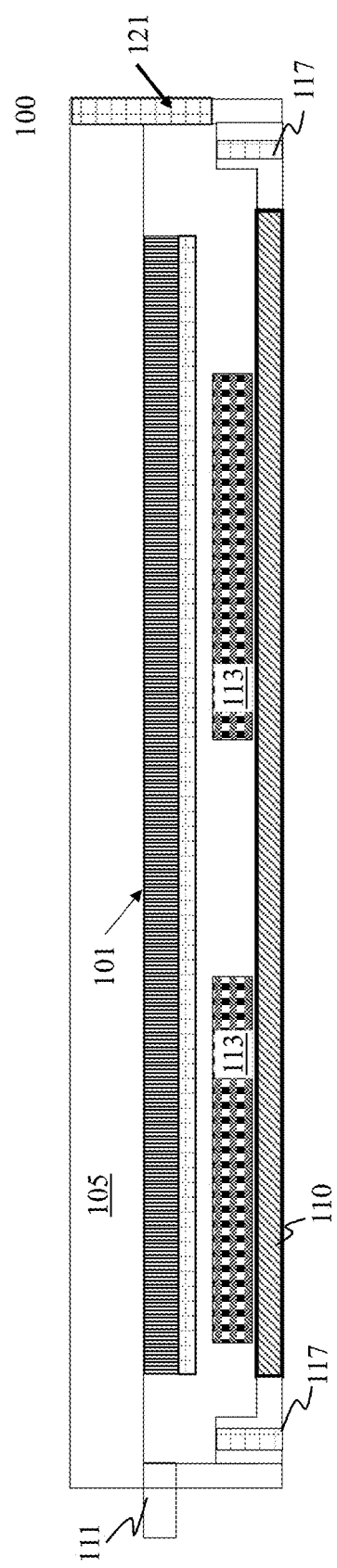
FIG. 5A is a side view illustrating a server package having an assembly kit securing a cooling unit to a server chassis according to one embodiment.
Figure 5B:
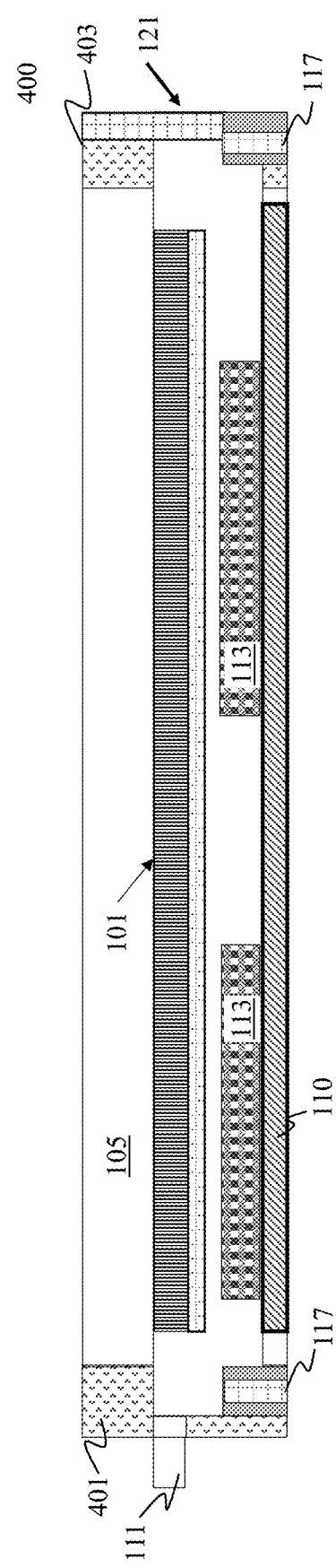
FIG. 5B is a side view illustrating server package having an assembly kit securing a cooling unit to a server chassis extension according to one embodiment.

FIG. 5A is a side view illustrating a server package 100 having an assembly kit securing a cooling unit 101 to a server chassis 105 according to one embodiment. FIG. 5B is a side view illustrating a server package 400 having an assembly kit securing a cooling unit 101 to server chassis extensions 401 and 403 according to one embodiment. As shown in FIG. 5A, cooling unit 101 is integrated to server chassis 105 directly using an assembly kit including assembly structures 117. FIG. 5B shows cooling unit 101 is integrated to server chassis 105 through chassis extensions 401 and 403 with assembly structures 117 at two distal ends of cooling unit 101. In this case, inlet port 111 and outlet 121 are coupled to respective extensions 401 and 403.

FIG. 6 illustrates an IT cooling system 600 according to one embodiment. As shown in FIG. 6, cooling system 600 can include an IT enclosure 601 having two-phase immersion fluid 603 contained therein. Submerged in immersion fluid 603 are server packages 100A and 100B having different local two-phase coolant fluid acceleration mechanisms.

In one embodiment, IT enclosure 601 includes input manifold(s) 621 and an output manifold 623. Input manifold(s) 621 can be coupled to respective pump(s) 619 to direct two-phase coolant fluid from a facility line 617 to input manifold(s) 621. Input manifold(s) 621 can be fluidly coupled to server packages 100A-100B. In some embodiments, separate input manifolds 621 are used, where each manifold can provide a different flow rate to cooling units 101A-101B of server packages 100A-100B. Cooling units 101A-101B can be coupled to a respective manifold depending on the cooling rate requirements of the chips to be cooled by the cooling units 101A-101B.

Output manifold 623 can be a vapor manifold coupled to facility line 625 where two-phase coolant liquid in vapor phase is collected. In one embodiment, line 625 can be coupled to a facility cooler 627 where two-phase coolant fluid in vapor phase is condensed back to liquid phase and the coolant fluid in liquid phase is circulated to line 617. Manifold 621-623 can be pipes, tubes, or hoses, and so forth. In one embodiment, manifold 621 is disposed near a bottom region of IT enclosure 601 and manifold 621 is disposed near an upper region of IT enclosure 601.

Server package 100A can include a server board 110A with high-density chips 113 disposed on server board 110A. A cooling unit 101A is disposed on an acceleration region enclosing chips 113. Cooling unit 101A can be configured with inlet 111A coupled to manifold 621, where two-phase coolant fluid enters (e.g., liquid in 605) cooling unit 101A. In this scenario, the two-phase coolant fluid is distributed by internal structure 107A throughout cooling unit 101A and/or to chips 113, where heat is transferred from chips 113 to the two-phase coolant fluid to cause a portion of the two-phase coolant fluid to change from a liquid to vapor phase, while another portion of the hot two-phase coolant fluid remains in liquid phase. The liquid/vapor mixture then exits cooling unit 101A from perforation 301 in liquid phase 607 and/or vapor phase 609. The coolant fluid in liquid phase is then merged with the two-phase immersion fluid 603 in IT enclosure 601.

Server package 100B can include a server board 110B with high-density chips 113 disposed on server board 110B. A cooling unit 101B is disposed on an acceleration region enclosing chips 113. Cooling unit 101B can be configured with inlet 111B coupled to manifold 621, where two-phase coolant fluid enters (e.g., liquid in 611) into cooling unit 101B. In this scenario, the two-phase coolant fluid is distributed by internal structure 107B throughout cooling unit 101B and/or to chips 113, where heat is transferred from chips 113 to the two-phase coolant fluid to cause a portion of the two-phase coolant fluid to change from a liquid to vapor phase, while another portion of the hot two-phase coolant fluid remains in liquid phase. Server package 100B has outlet as a connector 303 and connector 303 can be coupled to manifold 623 via line 615. The vapor portion of the liquid/vapor mixture can rise from cooling unit 101A via connector 303 in vapor phase 613 to manifold 623 via line 615.

In some embodiments, inlets 111A-111B are attached with respective female connectors 631A-631B while corresponding male connectors 633A-633B are assembled along manifold(s) 621 at configurable lengths between structural posts 635A-635B. In one embodiment, connectors 631A-B, 633A-B are dripless blind-mating connectors. In one embodiment, enclosure 601 can include structural posts 635A-635B or the like assembled at the bottom of enclosure 601 and the structural posts 635A-635B are used to guide the blind-mating connections. For example, male connectors 633A-633B can be coupled to complementary female connectors 631A-631B when server packages 100A-B are pushed in at the predetermined slots defined by the structural posts 635A-635B. Although structural posts are shown, a vertical panel, bar, or other elements can be used to guide the blind-mating connections.

In one embodiment, instead of two-phase immersion/coolant fluid, cooling system 600 can utilize single-phase immersion/coolant fluid. For example, output manifold 623 can include a liquid manifold. In this case, when single-phase coolant fluid flows to the surface of chips 113, heat is transferred from chips 113 to the single-phase coolant fluid that remains in liquid phase. Liquid coolant then exits cooling unit 101A from perforation 301 and merges with the immersion fluid 603 in IT enclosure 601 or exits cooling unit 101B to manifold 623 via connector 303/line 615.

Thus, cooling system 600 can provide local acceleration of single-phase or two-phase coolant fluid to high power density chips at the server package level and at the same time, the local fluid acceleration can be implemented without significant modifications to existing server chassis designs.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling unit, comprising:
a channel frame assembled to a server chassis to form a region enclosing an electronic chip that is disposed on a server board contained within the server chassis;
an inlet port coupled to a first side of the channel frame to receive a two-phase coolant fluid;
an outlet port coupled to a second side of the channel frame for the two-phase coolant fluid in either a liquid phase or a vapor phase to exit the channel frame;
an internal structure disposed on an inner surface of the channel frame between the inlet port and the outlet port, wherein the internal structure guides the two-phase coolant fluid along a surface of the electronic chip, wherein the electronic chip transfers heat to the two-phase coolant fluid to cause a portion of the two-phase coolant fluid to change from a liquid to a vapor phase; and
a flexible skirt surrounding the channel frame and in contact with the server board, wherein the flexible skirt minimizes leakage of the two-phase coolant through gaps between the cooling unit and the server board.

2. The cooling unit of claim 1, wherein the internal structure comprises a set of fins, each fin of the set of fins aligned along a length between the inlet and outlet ports to form a plurality of fluid channels, wherein the set of fins is asymmetrical or symmetrical to the internal structure, wherein the plurality of fluid channels directs the two-phase coolant fluid to flow unevenly or evenly along the surface of the electronic chip.

3. The cooling unit of claim 1, wherein the internal structure comprises a layer with perforated openings facing the surface of the electronic chip.

4. The cooling unit of claim 1, wherein the server chassis is submerged in an immersion fluid.

5. The cooling unit of claim 4, wherein the outlet port is an open perforation, the two-phase coolant fluid is a same fluid as an immersion fluid, and the two-phase coolant fluid that exits the channel frame merges with the immersion fluid.

6. The cooling unit of claim 4, wherein the outlet port is coupled to a connector connecting the outlet port to a fluid line, the two-phase coolant fluid is a different fluid than the immersion fluid, and the fluid line directs the two-phase coolant fluid that exits the channel frame to a facility cooler.

7. The cooling unit of claim 1, further comprising an assembly kit that is used to secure the channel frame to the server chassis.

8. The cooling unit of claim 1, further comprising a server chassis extension secured to the server chassis, the server chassis extension extends a length of the server chassis and an assembly kit is secured to the chassis extension, wherein the assembly kit is used to secure the channel frame to the chassis extension.

9. The cooling unit of claim 8, wherein the assembly kit comprises a first assembly structure disposed on the server chassis near the inlet port and a second assembly structure disposed on the server chassis near the outlet port, wherein the first and second assembly structures are used to secure the channel frame to the server chassis.

10. A server, comprising:
a server chassis securing a server board within the server chassis; and
a cooling unit, comprising:
a channel frame assembled to the server chassis to form a region enclosing an electronic chip that is disposed on the server board;
an inlet port coupled to a first side of the channel frame to receive a two-phase coolant fluid;
an outlet port coupled to a second side of the channel frame for the two-phase coolant fluid in either a liquid phase or a vapor phase to exit the channel frame;
an internal structure disposed on an inner surface of the channel frame between the inlet port and the outlet port, wherein the internal structure guides the two-phase coolant fluid along a surface of the electronic chip, wherein the electronic chip transfers heat to the two-phase coolant fluid to cause a portion of the two-phase coolant fluid to change from a liquid to a vapor phase; and
a flexible skirt surrounding the channel frame and in contact with the server board, wherein the flexible skirt minimizes leakage of the two-phase coolant through gaps between the cooling unit and the server board.

11. The server of claim 10, wherein the internal structure comprises a set of fins, each fin of the set of fins aligned along a length between the inlet and outlet ports to form a plurality of fluid channels, wherein the set of fins is asymmetrical or symmetrical to the internal structure, wherein the plurality of fluid channels directs the two-phase coolant fluid to flow unevenly or evenly along the surface of the electronic chip.

12. The server of claim 10, wherein the internal structure comprises a layer with perforated openings facing the surface of the electronic chip.

13. The server of claim 10, wherein the server chassis is submerged in an immersion fluid.

14. The server of claim 13, wherein the outlet port is an open perforation, the two-phase coolant fluid is a same fluid as an immersion fluid, and the two-phase coolant fluid that exits the channel frame merges with the immersion fluid.

15. The server of claim 13, wherein the outlet port is coupled to a connector connecting the outlet port to a fluid line, the two-phase coolant fluid is a different fluid than the immersion fluid, and the fluid line directs the two-phase coolant fluid that exits the channel frame to a facility cooler.

16. The server of claim 10, further comprising an assembly kit that is used to secure the channel frame to the server chassis.

17. The server of claim 10, further comprising a server chassis extension secured to the server chassis, the server chassis extension extends a length of the server chassis and an assembly kit is secured to the chassis extension, wherein the assembly kit is used to secure the channel frame to the chassis extension.

18. The server of claim 17, wherein the assembly kit comprises a first assembly structure disposed on the server chassis near the inlet port and a second assembly structure disposed on the server chassis near the outlet port, wherein the first and second assembly structures are used to secure the channel frame to the server chassis.

19. A cooling system, comprising:
one or more servers, each server of the one or more servers comprising:
a server chassis securing a server board within the server chassis; and a cooling unit, comprising:
- a channel frame assembled to the server chassis to form a region enclosing an electronic chip that is disposed on the server board;
- an inlet port coupled to a first side of the channel frame to receive a two-phase coolant fluid;
- an outlet port coupled to a second side of the channel frame for the two-phase coolant fluid in either a liquid phase or a vapor phase to exit the channel frame;
- an internal structure disposed on an inner surface of the channel frame between the inlet port and the outlet port, wherein the internal structure guides the two-phase coolant fluid along a surface of the electronic chip, wherein the electronic chip transfers heat to the two-phase coolant fluid to cause a portion of the two-phase coolant fluid to change from a liquid to a vapor phase; and
- a flexible skirt surrounding the channel frame and in contact with the server board, wherein the flexible skirt minimizes leakage of the two-phase coolant through gaps between the cooling unit and the server board.

20. The cooling system of claim 19, wherein the internal structure comprises a set of fins, each fin of the set of fins aligned along a length between the inlet and outlet ports to form a plurality of fluid channels, wherein the set of fins is asymmetrical or symmetrical to the internal structure, wherein the plurality of fluid channels directs the two-phase coolant fluid to flow unevenly or evenly along the surface of the electronic chip.

* * * * *